United States Patent
Hellwig et al.

(10) Patent No.: US 10,965,385 B1
(45) Date of Patent: Mar. 30, 2021

(54) METHOD OF REDUCING A NOISE-INDUCED SIGNAL DRIFT AND TEST INSTRUMENT

(71) Applicant: Rohde & Schwarz GmbH & Co. KG, Munich (DE)

(72) Inventors: Mathias Hellwig, Munich (DE); Bendix Koopmann, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 16/788,859

(22) Filed: Feb. 12, 2020

(51) Int. Cl.
  *H04B 15/00* (2006.01)
  *H04B 17/10* (2015.01)

(52) U.S. Cl.
  CPC ......... *H04B 15/005* (2013.01); *H04B 17/101* (2015.01)

(58) Field of Classification Search
  CPC .................. H04B 15/005; H04B 17/101
  See application file for complete search history.

(56) References Cited

U.S. PATENT DOCUMENTS

| | | | | |
|---|---|---|---|---|
| 5,645,077 | A | 7/1997 | Foxlin | |
| 2003/0098696 | A1* | 5/2003 | Li | G01R 27/28 324/615 |
| 2015/0369898 | A1* | 12/2015 | Torin | G01R 25/00 324/750.02 |
| 2017/0328932 | A1* | 11/2017 | Hickman | H03M 1/12 |
| 2019/0086468 | A1* | 3/2019 | Yoshino | G01R 31/2834 |

OTHER PUBLICATIONS

Takeda, R., et al., "Drift Removal for Improving the Accuracy of Gait Parameters Using Wearable Sensor Systems," Sensors 14:23230-23247, Dec. 2014.

\* cited by examiner

*Primary Examiner* — Vineeta S Panwalkar
(74) *Attorney, Agent, or Firm* — Christensen O'Connor Johnson Kindness PLLC

(57) ABSTRACT

The present disclosure relates to a method of reducing a noise induced signal drift. The method comprises: receiving an input signal; recording a waveform of the input signal; and determining an antiderivative of the waveform by optimizing a derivative of the antiderivative to be determined and an absolute deviation of the antiderivative to be determined. Further, the present disclosure relates to a test instrument for analyzing an input signal.

18 Claims, 2 Drawing Sheets

METHOD OF REDUCING A NOISE-INDUCED SIGNAL DRIFT AND TEST INSTRUMENT

FIELD OF THE DISCLOSURE

Embodiments of the present disclosure generally relate to a method of reducing a noise-induced signal drift. Further, embodiments of the present disclosure relate to a test instrument for analyzing an input signal.

BACKGROUND

Modern test instruments such as oscilloscopes are used to provide different variables of a signal. Usually, the test instruments are enabled to directly measure certain variables of an input signal, which are called supervised variables, as they are directly monitored or rather sensed. However, modern test instruments are also capable of monitoring non-supervised variables that are not directly measured, but indirectly determined.

For obtaining non-supervised variables, the respective input signal or a waveform thereof may have to be integrated over time. However, when integrating the input signal or its waveform, a noise of the input signal introduced by a frontend of the test instrument accumulates, for instance the so-called 1/f noise. Accordingly, very small offsets already result in the integral diverging from zero. Particularly, the divergence increases over time. Put differently, the integral obtained runs away. Consequently, the integral obtained does not comply with the (mathematically determined) antiderivative of the waveform or the input signal. This becomes obvious when deviating the integral with respect to time since the result thereof does not comply with the initial waveform.

So far, it is known to filter the noise in the frequency spectrum obtained. However, an automatic filtering is critical, as the respective frequencies are not easy to separate. Further, a manual selection of noise frequencies requires that the input signal is known a priori.

SUMMARY

Accordingly, there is a need for a method and test instrument that ensure reduction of noise artefacts in integrals of the input signal.

Embodiments of the present disclosure provide a method of reducing a noise-induced signal drift. In an embodiment, the method comprises the steps of:

receiving an input signal, recording a waveform of the input signal, and determining an antiderivative of the waveform by optimizing a derivative of the antiderivative to be determined and an absolute deviation of the antiderivative to be determined.

Further, embodiments of the present disclosure provide a test instrument for analyzing an input signal. In an embodiment, the test instrument comprises an input and a processing circuit or module. The input is configured to receive an input signal. The processing module is configured to record a waveform of the input signal. Further, the processing module is configured to determine an antiderivative of the waveform by optimizing a derivative of the antiderivative to be determined and an absolute deviation of the antiderivative to be determined.

Accordingly, the present disclosure is based on the finding that the antiderivative of the input signal, namely the antiderivative of the waveform, can be determined in a mathematical manner by solving an optimization problem associated with the absolute deviation as well as a relative deviation of the antiderivative to be determined. In some embodiments, the optimization problem is created such that the derivative of the antiderivative shall resemble the waveform of the input signal, and wherein the antiderivative shall not diverge from zero, which would be the case if the waveform or rather input signal is integrated over time due to the noise introduced that accumulates. Accordingly, the present disclosure provides a balancing between two different effects, namely a small deviation of the derivative of the antiderivative to be determined from the waveform (relative deviation) as well as the absolute deviation of the antiderivative to be determined from zero.

In other words, the method balances the shape of the waveform of the input signal and the divergence of the antiderivative to be determined from zero globally, as these criteria are taken into consideration when solving the optimization problem. In some embodiments, this balancing works by locally altering the antiderivative such that occurring noise in the input signal is counteracted or rather compensated. The local altering means that the altering does not take place everywhere, but only at certain places.

In general, the optimization problem is solved (automatically by a respective algorithm) in order to determine the antiderivative of the waveform.

In some embodiments, frequencies deemed to be assigned to noise do not have to be cancelled. Moreover, a priori knowledge of the input signal is also not required.

According to an aspect, the absolute deviation of the antiderivative to be determined corresponds to a divergence from zero of the antiderivative to be determined. This means that the antiderivative shall be determined such that any effect introduced by noise of the test instrument, for example its frontend, does not occur. Therefore, the run-away of the integral does not take place in contrast to the simple integration of the waveform of the input signal.

Hence, the antiderivative may be determined differently than simply integrating the waveform. In some embodiments, the simple integration of the waveform would result in accumulated noise introduced by the frontend the test instrument processing the input signal. This accumulated noise would result in a divergence from zero that increases over time. However, this divergence shall be minimized when solving the optimization problem, for example the term assigned to the absolute deviation of the antiderivative to be determined.

According to another aspect, the antiderivative is determined by a variation-based integration. As mentioned above, the antiderivative is determined by locally altering the respective antiderivative, which results in a respective variable integration, also called variation-based integration. In other words, the integration is based on a variation. Generally, this ensures that the antiderivative determined is in compliance with both different goals, namely the resembling of the waveform of the input signal and the divergence being minimized.

Another aspect provides that the antiderivative is determined by minimizing the absolute deviation of the antiderivative to be determined and by minimizing the relative deviation of the derivative of the antiderivative to be determined from the waveform simultaneously. In some embodiments, the method balances these different goals, as the derivative of the antiderivative shall resemble the waveform of the input signal and it shall diverge from zero minimally. By solving the optimization problem appropriately, both goals can be reached.

For instance, the antiderivative is determined by $$x = \min_x \sum (\partial x - f)^2 + a \cdot \sum |x|,$$

wherein x corresponds to the antiderivative to be determined. ∂x corresponds to the derivative of the antiderivative to be determined. f corresponds to the waveform of the input signal. a corresponds to a regularization parameter. The above-mentioned formula corresponds to the optimization problem to be solved.

In some embodiments, the regularization parameter balances between a minimization of the absolute deviation of the antiderivative to be determined and a minimization of the relative deviation of the derivative of the antiderivative to be determined from the waveform. Thus, the regularization parameter balances between the different goals to be achieved simultaneously.

In case of a high value of the regularization parameter, the antiderivative determined diverges minimally from zero. Hence, the focus is on minimizing the absolute deviation (from zero), wherein the relative deviation is of subordinated importance, namely the resembling of the waveform of the input signal.

In case of a small value of the regularization parameter, the deviation of the antiderivative resembles the waveform of the input signal. Hence, the focus is on minimizing the relative deviation (high resembling), wherein the absolute deviation is of subordinated importance, namely the deviation from zero.

Thus, the optimization problem to be solved in order to determine the antiderivative results in a value for the regularization parameter providing a good trade-off between the two different goals.

Generally, the antiderivative of the waveform may be determined such that a noise-induced signal drift is reduced. Thus, noise artefacts are reduced significantly.

For instance, the noise is band-limited. The band-limited noise may be a so-called pink noise.

Another aspect provides that the noise is caused by at least one circuit of a test instrument that receives the input signal. Hence, noise introduced by the test instrument processing the input signal can be compensated appropriately by one or more methods of the present disclosure.

According to another aspect, at least one parameter of the antiderivative is determined. This parameter may be used in order to monitor a non-supervised variable.

In some embodiments, the parameter corresponds to power, energy and/or location. Hence, typically non-supervised variables can be determined in a more accurate manner due to the antiderivative obtained by the methods described above.

In some embodiments, the antiderivative may be determined by locally altering the antiderivative to be determined. As mentioned above, a balancing with regard to the two different goals takes place when performing the respective method such that the antiderivative is locally altered.

An aspect provides that the test instrument has a frontend that comprises the input. The frontend also comprises at least one circuit processing the input signal, thereby introducing noise. The noise introduced by the frontend is compensated by the way how the antiderivative is determined, namely solving the respective optimization problem.

For instance, the processing module is configured to determine the antiderivative such that a noise-induced signal drift is reduced. The noise-induced signal drift is reduced, as the optimization problem takes the accumulated noise into account by considering the absolute deviation of the antiderivative.

For instance, the test instrument has a display configured to display the antiderivative determined. Therefore, the respective outcome of the method described above can be displayed for informing an operator. The operator can verify the respective result.

In some embodiments, the test instrument is an oscilloscope.

Generally, the test instrument is configured to perform the methods of reducing the noise induced signal drift described above.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
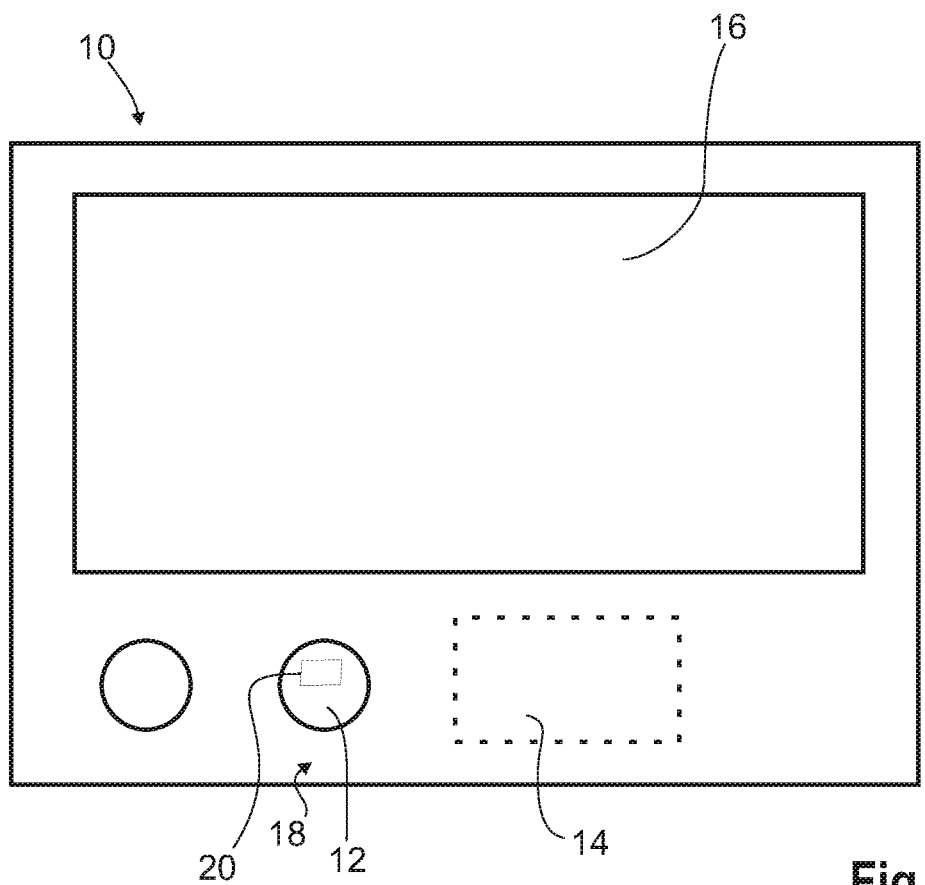
FIG. 1 schematically shows a test instrument according to an embodiment of the present disclosure.

In FIG. 1, a test instrument 10 for analyzing an input signal is shown. The test instrument 10 comprises an input 12 for receiving the input signal as well as a processing circuit or module 14 that is connected with the input 12. Hence, the input signal received is forwarded to the processing module 14 via the input 12 for internal processing.

Further, the test instrument 10 has a display 16 that is also connected with the processing module 14 such that a result of the processing module 14 can be displayed on the display 16 for informing an operator of the test instrument 10.

In the shown embodiment, the test instrument 10 is established by an oscilloscope that has an integrated display 16.

In general, the test instrument 10 has a frontend 18 that comprises the at least one input 12. The frontend 18 has at least one circuit 20 that is used to process the input signal received via the input 12 prior to forwarding the input signal to the processing module 14 for further processing.

However, the circuit 20 may introduce noise in the input signal that may result in problems when processing the input signal to obtain a non-supervised variable of the input signal. The respective noise is typically band limited. For instance, the noise corresponds to pink noise.

Figure 3:
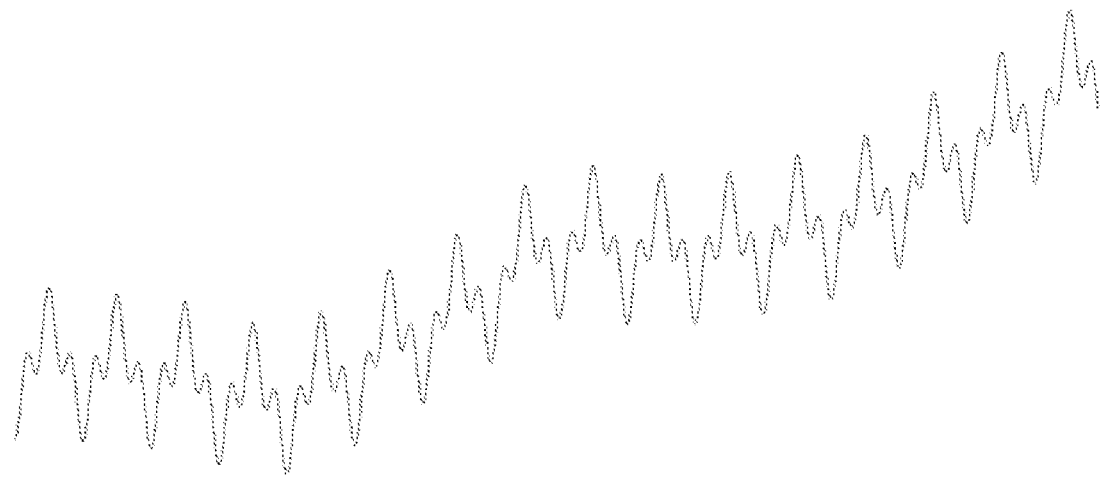
FIG. 3 shows an integral of an input signal according to the state of the art.

For instance, the input signal or rather a waveform associated therewith has to be integrated in order to gather the non-supervised variable, which results in a run-away of the integral due to the noise accumulating over time. This effect is illustrated in FIG. 3. In some embodiments, low-frequency noise and minimal offsets introduced by the frontend 18 result in the so-called wandering of the integral as. In other words, the integral runs away over time, resulting in inaccurate results.

Figure 2:
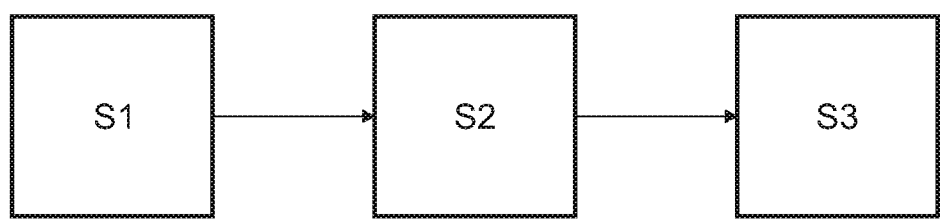
FIG. 2 schematically shows a flow-chart illustrating a method according to an embodiment of the present disclosure.

Therefore, the test instrument 10 is configured to perform a method as illustrated, for example, in FIG. 2.

In a first step S1, an input signal is received via the input 12 of the test instrument 10.

In a second step S2, the input signal is processed such that a waveform of the input signal is recorded.

In a third step, S3, an antiderivative of the waveform is determined by optimizing a derivative of the antiderivative to be determined and an absolute deviation of the antiderivative to be determined. In some embodiments, an optimization problem created is solved, yielding in the optimization of the derivative of the antiderivative to be determined and the absolute deviation of the antiderivative to be determined, namely a minimized divergence from zero of the antiderivative to be determined.

The optimization problem in order to determine the antiderivative of the waveform is solved by the processing module 14 that processes the input signal received, for example the waveform recorded.

Therefore, the processing module 14 solves the optimization problem that is defined by $$x = \min_x \sum (\partial x - f)^2 + a \cdot \sum |x|,$$

wherein x corresponds to the antiderivative to be determined, $\partial x$ corresponds to the derivative of the antiderivative to be determined, f corresponds to the waveform, and a corresponds to a regularization parameter.

In some embodiments, the optimization problem to be solved for determining the antiderivative of the waveform comprises two different aspects that are associated with two different goals.

The first term, $\Sigma(\partial x-f)^2$, relates to a resembling of the derivative of the antiderivative to be determined with the initial waveform, as the derivative shall correspond to the waveform of the input signal. Hence, this first term corresponds to a minimization of a relative deviation.

The second term, $\Sigma|x|$, relates to the absolute deviation of the antiderivative to be determined, namely a divergence from zero.

Both terms shall be minimized simultaneously in order to determine the antiderivative in an optimum manner.

Therefore, the regularization parameter a has to be determined in an appropriate manner when solving the optimization problem mentioned above.

In some embodiments, the regularization parameter balances between the minimization of the absolute deviation and the minimization of the relative deviation, ensuring that both effects are taken into account.

Both effects counteract against each other, as a perfect resembling (minimized relative deviation) associated with the first term would result in the run-away that shall be suppressed by minimizing the second term.

Therefore, the regularization parameter provides the respective trade-off between these different goals.

In any case, the optimization problem solved ensures that noise-induced signal drift due to noise introduced by the frontend 18, for example its circuits 20, is reduced. In other words, noise artefacts are reduced appropriately. This is illustrated in FIG. 4 showing the antiderivative determined according to the method of the present disclosure.

Figure 4:
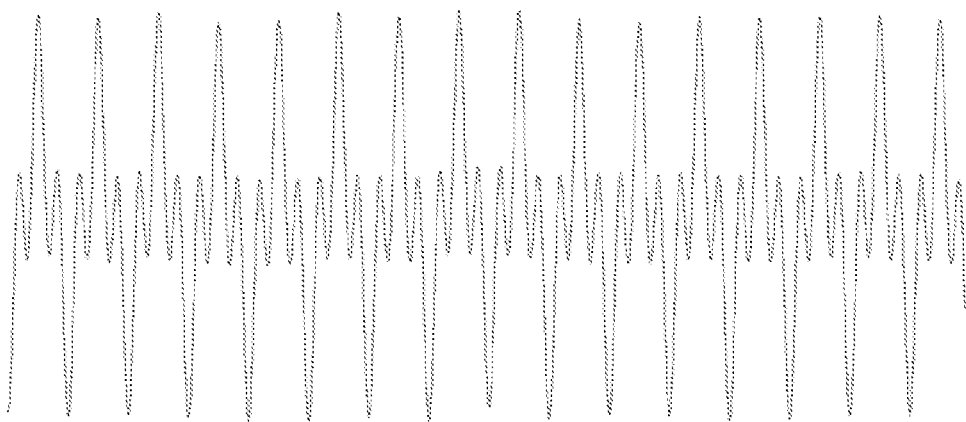
FIG. 4 shows an integral obtained by a method according to an embodiment of the present disclosure.

In some embodiments, a comparison of the diagrams shown in FIGS. 3 and 4 reveal that the antiderivative determined according to an example method of the present disclosure provides a more accurate integration compared with the simple integration shown in FIG. 3.

Accordingly, the antiderivative is determined differently than simply integrating the waveform, as the respective optimization problem is solved. In some embodiments, the antiderivative is determined by a variation-based integration due to the local adaption when solving the optimization problem. Put differently, the antiderivative is determined by the method according to the present disclosure while locally altering the antiderivative to be determined when solving the optimization problem.

Since the antiderivative is determined more accurately, at least one parameter of the antiderivative can be determined in a more accurate manner later on, for example in a post-processing. Therefore, any non-supervised value can be determined more accurately, for instance power, energy and/or location.

Generally, the method and the test instrument reduce any noise artefacts introduced by the frontend 18 in an integral of the input signal, as this integral is determined differently than simply integrating the waveform of the input signal.

Certain embodiments disclosed herein utilize circuitry (e.g., one or more circuits) in order to implement protocols, methodologies or technologies disclosed herein, operably couple two or more components, generate information, process information, analyze information, generate signals, encode/decode signals, convert signals, transmit and/or receive signals, control other devices, etc. Circuitry of any type can be used.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method of reducing a noise induced signal drift, said method comprising:
   receiving an input signal;
   recording a waveform of said input signal; and
   determining an antiderivative of said waveform by optimizing a derivative of said antiderivative to be determined and an absolute deviation of said antiderivative to be determined.

2. The method according to claim 1, wherein said absolute deviation of said antiderivative to be determined corresponds to a divergence from zero of said antiderivative to be determined.

3. The method according to claim 1, wherein said antiderivative is determined differently than simply integrating said waveform.

4. The method according to claim 1, wherein said antiderivative is determined by a variation-based integration.

5. The method according to claim 1, wherein said antiderivative is determined by minimizing said absolute deviation of said antiderivative to be determined and by minimizing said relative deviation of said derivative of said antiderivative to be determined from said waveform simultaneously.

6. The method according to claim 1, wherein said antiderivative is determined by $$x = \min_x \sum (\partial x - f)^2 + a \cdot \sum |x|,$$

wherein x corresponds to said antiderivative to be determined, wherein $\partial x$ corresponds to said derivative of said antiderivative to be determined, wherein f corresponds to said waveform, and wherein a corresponds to a regularization parameter.

7. The method according to claim 6, wherein said regularization parameter balances between a minimization of said absolute deviation of said antiderivative to be determined and a minimization of said relative deviation of said derivative of said antiderivative to be determined from said waveform.

8. The method according to claim 1, wherein said antiderivative of said waveform is determined such that a noise induced signal drift is reduced.

9. The method according to claim 8, wherein said noise is band limited.

10. The method according to claim 8, wherein said noise is caused by at least one circuit of a test instrument that receives said input signal.

11. The method according to claim 1, wherein at least one parameter of said antiderivative is determined.

12. The method according to claim 11, wherein said parameter corresponds to at least one of power, energy and location.

13. The method according to claim 1, wherein said antiderivative is determined by locally altering said antiderivative to be determined.

14. A test instrument for analyzing an input signal, said test instrument comprising an input and a processing circuit, said input being configured to receive an input signal, said processing circuit being configured to record a waveform of said input signal, said processing circuit being further configured to determine an antiderivative of said waveform by optimizing a derivative of said antiderivative to be determined and an absolute deviation of said antiderivative to be determined.

15. The test instrument according to claim 14, wherein said test instrument has a frontend that comprises said input, said frontend also comprising at least one circuit processing said input signal, thereby introducing noise.

16. The test instrument according to claim 15, wherein said processing circuit is configured to determine said antiderivative such that a noise induced signal drift is reduced.

17. The test instrument according to claim 14, wherein said test instrument has a display configured to display said antiderivative determined.

18. The test instrument according to claim 14, wherein said test instrument is an oscilloscope.

* * * * *